United States Patent [19]

Bendall et al.

[11] Patent Number: 4,682,107
[45] Date of Patent: Jul. 21, 1987

[54] METHOD OF OPERATING A NUCLEAR MAGNETIC RESONANCE SPECTROMETER

[76] Inventors: Max R. Bendall, 274 Ford Road, Burbank, Queensland, Australia, 4123; David T. Pegg, 7 Fanfare Street, 8 Mile Plains, Brisbane, Queensland, Australia, 4123

[21] Appl. No.: 715,244

[22] Filed: Mar. 25, 1985

[30] Foreign Application Priority Data

Mar. 29, 1984 [EP] European Pat. Off. ........ 84103483.8

[51] Int. Cl.[4] ............................................ G01R 33/20
[52] U.S. Cl. ..................................... 324/307; 324/308
[58] Field of Search ............... 324/300, 307, 308, 309, 324/311, 312, 314, 313

[56] References Cited

U.S. PATENT DOCUMENTS

| 4,045,723 | 8/1977 | Ernst | 324/312 |
| 4,068,161 | 1/1978 | Ernst | 324/311 |
| 4,238,735 | 12/1980 | Muller | 324/314 |
| 4,443,761 | 4/1984 | Levitt | 324/314 |
| 4,486,709 | 12/1984 | Bendall | 324/314 |
| 4,521,732 | 6/1985 | Pegg et al. | 324/308 |

Primary Examiner—Michael J. Tokar
Attorney, Agent, or Firm—Frank H. Foster

[57] ABSTRACT

In a method of operating a nuclear magnetic resonance (NMR) spectrometer in relation to a sample comprising two types of nuclei, a sequence of radiofrequency pulses and delay periods is applied using two different radiofrequency coils, one for each type of nucleus, each coil providing an inhomogeneous radiofrequency field, so that the two coils generate separate but overlapping sensitive volumes for each of the two types of nuclear species, whereby signal intensity is substantially limited to the overlap volume.

4 Claims, 4 Drawing Figures

METHOD OF OPERATING A NUCLEAR MAGNETIC RESONANCE SPECTROMETER

The invention relates to a method of operating a nuclear magnetic resonance spectrometer in relation to a sample comprising two types of nuclei, in which a sequence of radiofrequency pulses and delay periods, the pulses thereof having two different radiofrequencies corresponding to the two types of nuclei, is applied to the two nuclei such that the nuclear scalar coupling interactions between the two types of nuclei are allowed to evolve.

Such a method is disclosed in No. EP-A-0 089 034, and consists in applying special pulse sequences, called DEPT sequences, to relatively homogeneous rf coils positioned adjacent to the sample, which is included in a sample vessel. The result of this method are NMR spectra providing information about the chemical environment of the two nuclear spins and thus information about the structure of the chemical compounds in which the two nuclear spins are found.

Further, in Journal of Magnetic Resonance 53, 365 (1982) and 54, 149 (1983), in Chemical Physics Letters 99, 310 (1983) and in Bull. Magn. Reson. 5, 191 (1983), a method of operating a nuclear magnetic resonance spectrometer is described in which an rf coil is used to generate an rf magnetic field when an rf pulse is applied thereto, said rf magnetic field varying grossly and continuously throughout the sample volume. As generally known in NMR-spectroscopy, an rf pulse of particular length and power rotates the magnetization of a nuclear species through an angle $\theta$, so that at any point in the sample space this angle is proportional to the strength of the rf field at that point in space. According to the said references, phase-cycled pulse sequences known as "depth pulse schemes or sequences" or just "depth pulses" are used to acquire NMR signals from sample regions where the $\theta$ pulse angle is between particular predetermined limits. These limits define a "sensitive volume" in sample space. This known method has been confined to a single nuclear species.

It is the object of the invention to provide a method to acquire NMR signals from defined regions or "localized volumes" in an extended sample giving information about the structure of chemical compounds included in this sensitive volume.

This object is achieved by applying the pulses of different radio frequencies to two different coils, respectively, each of which provides an inhomogeneous radiofrequency field, the two coils generating separate but overlapping sensitive volumes for each different nuclear species, so that a significant signal intensity will only be obtained from sample regions where the two sensitive volumes overlap.

Included within the scope of this invention is the application of any heteronuclear pulse sequence with two separate heteronuclear inhomogeneous rf coils defining different sensitive volumes, such that signal intensity is only obtained from one well defined localized volume in a larger sample, in which region the sensitive volumes overlap. A preferred heteronuclear pulse sequence is the DEPT pulse sequence as disclosed in No. EP-A-0 089 034. However, also heteronuclear spin-echo sequences and selective polarization transfer sequences may be used to generate two overlapping sensitive volumes.

Inhomogeneous rf coils of any shape are included within the scope of this invention and it is clearly possible to vary the shape and the position of the coils to tailor the shape of the final localized region, as defined by the two overlapping sensitive volumes.

The invention, its objectives and features will be better understood and appreciated from the following detailed description of the theory underlying the invention and of specific examples of use of the inventive method, with reference to the accompanying drawings. The methods are exemplified in terms of $^{13}CH_n$ systems ($n=1,2,3$), a most important problem in in vivo spectroscopy which could benefit from the invention. The terminology used before and in the following description is commonly used in the NMR literature.

Figure 1:
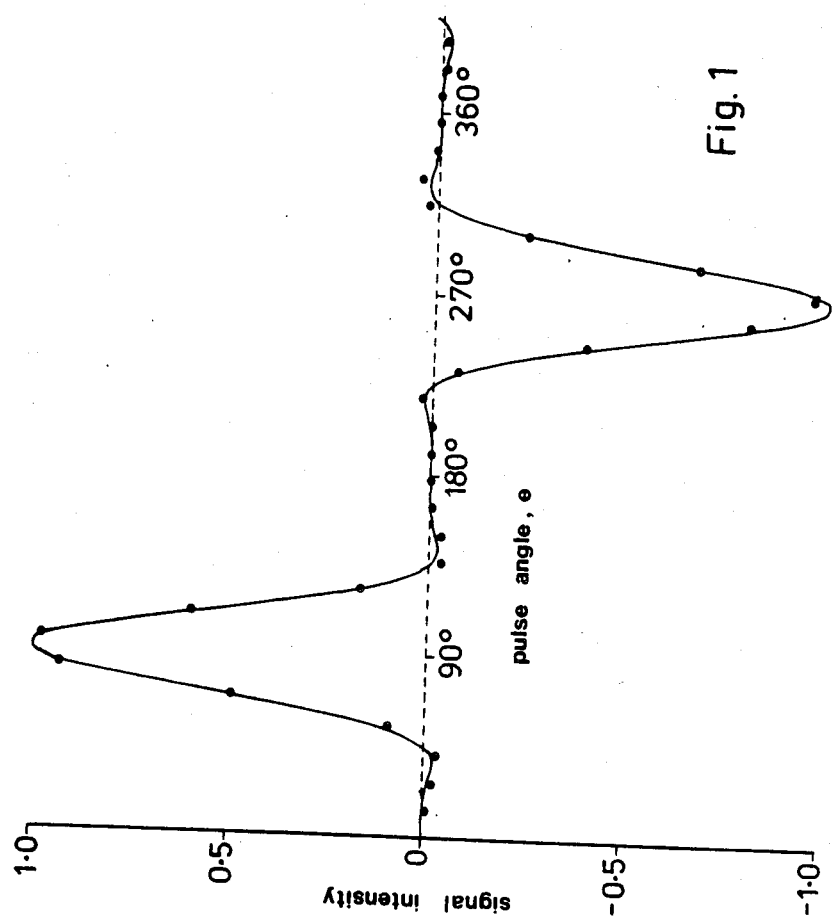
FIG. 1 is a diagram showing the dependence of signal intensity on the $^{13}C$ $\theta$ pulse length using the pulse sequence $(\pi/2)[H,x]-(2J)^{-1}-\pi[H]$; $2\theta[\pm x]$; $\theta$; $2\theta[\pm x,\pm y]-(2J)^{-1}-(\pi/4)[H,y]$; $2\theta[\pm x,\pm y]-(2J)^{-1}$ —acquire $^{13}C$ signal.

As mentioned above, a well-established pulse sequence for polarization transfer between spin-half systems is the DEPT sequence. For polarization transfer from $^{1}H$ to $^{13}C$ it may be written

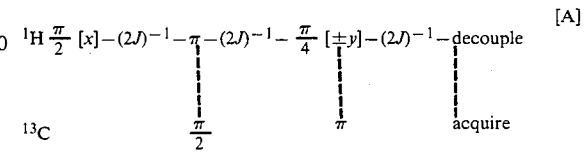

[A]

J is the $^{13}C-^{1}H$ coupling constant for directly-bonded nuclei. The $\pi/4[\pm y]$ pulse takes a compromise angle to simultaneously yield polarization transfer for methyl ($CH_3$), methylene ($CH_2$) and methine (CH) groups, the polarization transfer enhancement being near maximum for $CH_3$ and $CH_2$ groups and 71% of maximum for CH groups. The $[\pm y]$ alternation of the phase of this pulse is generally employed in conjunction with alternation of receiver phase to eliminate the natural $^{13}C$ magnetization. The DEPT sequence is a good pulse sequence to investigate for application to coils which produce inhomogeneous rf fields, because it contains the smallest possible number of pulses for polarization transfer across a range of chemical shifts: three pulses to achieve the transfer and two refocusing ($\pi$) pulses to refocus the $^{1}H$ and $^{13}C$ chemical shift.

For inhomogeneous rf coils, the pulse angles will vary continuously throughout the sample, and it is more representative to write the $^{13}C$ pulses as $\theta$ and $2\theta$, respectively, and the $^{1}H$ pulses as $\phi$, $2\phi$, and $\phi/2$, respectively. In sample regions where the pulse angles diverge greatly from the ideal $\pi/4$, $\pi/2$, and $\pi$ angles, polarization transfer will occur with much lower efficiency. As the $2\phi$ pulses diverge from $\pi$, the chemical shift of the $^1$H spins is refocused with less efficiency and so polarization transfer will also depend on the magnitude of the $^1$H shift. Other complications will arise. For example, depending on the $^1$H shift, when the $2\phi$ pulse is close to $\pi/2$, polarization transfer will also occur via the first three pulses in an INEPT-like mechanism (see Morris and Freeman, J. Am. Chem. Soc., 101, 760 (1979). As the $2\theta$ pulses diverge from $\pi$, the chemical shift of the $^{13}$C spins is refocused with less efficiency, and phase errors occur in the final signal.

The variable effect of variable chemical shift, when $2\theta$ and $2\phi$ diverge from $\pi$, can be entirely removed by cycling the phase of these pulses through all four quadrants, written $2\theta[\pm x, \pm y]$ for example, during a series of transients. The basic DEPT sequence for inhomogeneous rf coils thus becomes

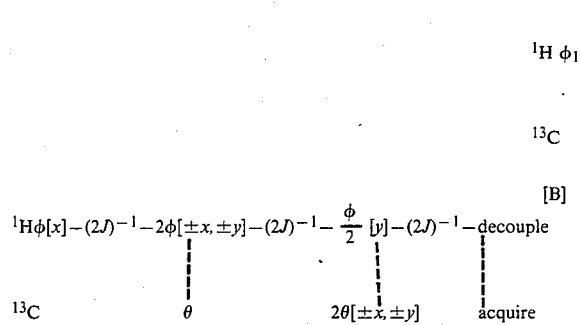

[B]

The phase cycling of the $^{13}$C pulse is easily explained in terms of the above-mentioned Bendall-references. The $\theta - (2J)^{-1} - 2\theta - (2J)^{-1} -$ portion of DEPT can be thought of as a spin-echo sequence whose purpose is to refocus the $^{13}$C shift. Thus, cycling the phase of the $2\theta$ pulse makes the final signal magnitude independent of the $^{13}$C chemical shift. The phase cycling of the $2\phi$ pulse can be explained in the same way if the $\phi - (2J)^{-1} - 2\phi - (2J)^{-1} -$ portion of the DEPT sequence is also considered to be a spin-echo sequence. Although these simple analogies are helpful, it is preferable to establish these phase-cycled pulses, and others used in depth pulse schemes, by rigorous theory.

With phase cycling of both the $2\theta$ and $2\phi$ pulses, a cycle of 16 transients is necessary. In the manner previously described for depth pulses, the receiver phase must be inverted whenever either of the phases of the $2\theta$ or $2\phi$ pulses are changed from $\pm x$ to $\pm y$. The phase cycling of the $2\phi$ pulse has no effect on the natural $^{13}$C magnetization, and so inversion of the receiver phase when the $2\phi$ pulse phase is changed from $\pm x$ to $\pm y$ eliminates this natural magnetization. Consequently, alternation of the $\phi/2$ pulse phase (written $\pi/4[\pm y]$ for ideal pulses) is not required when the $2\phi[\pm x, \pm y]$ phase cycle is used.

In the following work we represent the action of a $\phi[\pm x]$ additive pulse cycle on an angular momentum operator I by an operator $T(I_x, \phi)$, for which we can deduce the relations for the average effect per transient, by explicitly adding the results for $\phi[+x]$ and $\phi[-x]$, and dividing by the number of transients:

$$T(I_x, \phi)I_zT^+(I_x,\phi) = I_z \cos\phi \quad [1]$$

$$T(I_x,\phi)I_xT^+(I_x,\phi) = I_x \quad [2]$$

$$T(I_x,\phi)I_yT^+(I_x,\phi) = I_y \cos\phi \quad [3]$$

with results for $T(I_y,\phi)$ obtained by cyclic permutations of x,y,z. Similarly the four-phase operator $F(I,\phi)$ describing the action of $\phi[\pm x, \pm y]$ with receiver addition for $\pm x$ and subtraction for $\pm y$ can be shown to have the properties, where again we have normalized by dividing by the number of transients (four):

$$F(I,\phi)I_zF^+(I,\phi) = 0 \quad [4]$$

$$F(I,\phi)I_xF^+(I,\phi) = I_x \sin^2(\phi/2) \quad [5]$$

$$F(I,\phi)I_yF^+(I,\phi) = -I_y \sin^2(\phi/2) \quad [6]$$

and so $$F(I,\phi)I^+F^+(I,\phi) = I^- \sin^2(\phi/2) \quad [7]$$

We consider the DEPT sequence in the form $$^1\text{H} \quad \phi_1[\pm y];\phi[y] - (2J)^{-1} - \phi_2[\pm x, \pm y] - (2J)^{-1} - \phi_3[x] - (2J)^{-1} - \text{decouple} \quad [C]$$

$$^{13}\text{C} \qquad\qquad\qquad \theta_1[\pm x];\theta_2 \qquad\qquad \theta_3[\pm x, \pm y] \qquad \text{acquire}$$

and follow the Heisenberg picture approach (Pegg and Bendall, Journal of Magnetic Resonance 53, 229 (1983)) to find the signal which is given by the real and imaginary parts of $<I^+(t)>$ where $$I^+(t) = U^{-1}I^+U \quad [8]$$
$$= U^{-1}|+><-|U$$

where we have substituted the projection operator form of $I^+$ for a spin-half nucleus. The expression for U is found as described in the cited reference, except that now we also include the two-phase and four-phase operators T and F described above. The action of the four-phase pulse is two-fold: it refocuses in the same way as a perfect $\pi[x]$ pulse, and it reduces the magnitudes of the transverse vector components by a factor $\sin^2(\phi/2)$, in accord with [4], [5] and [6]. The refocusing property when acting on the transverse components can be seen by comparing [5] and [6] with the action of a perfect $\pi[x]$ pulse. Consequently we can ignore chemical shift effects in the following.

Substituting for a part of U to calculate the effect of the $\theta_3[\pm x, \pm y]$ pulse in DEPT sequence [C]:

$$I^+(t) = \ldots \exp(iI_zS_z\pi)\exp(iS_x\phi_3)F(I, \quad [9]$$
$$\theta_3)\exp(iI_zS_z\pi)|+><+| \times \exp(-iI_zS_z\pi)F^+(I,$$
$$\theta_3)\exp(-iS_x\phi_3)\exp(-iI_zS_z\pi) \ldots$$
$$= \ldots \exp(iS_z\pi/2)\exp(iS_x\phi_3)\exp(iS_z\pi)F(I,$$
$$\theta_3)I^+F^+(I,\theta_3) \times \exp(iS_x\phi_3)\exp(iS_z\pi/2) \ldots$$
$$= \sin^2(\theta_3/2) \times$$
$$\ldots I^-\exp(iS_z\pi/2)\exp(iS_x\phi_3)\exp(iS_z\pi)\exp(iS_x\phi_3) \times$$
$$\exp(iS_z\pi/2) \ldots$$

from [7]. We note that this is just $\sin^2(\theta_3/2)$ multiplied by the normal DEPT result at this stage.

Continuing, that is inserting the next factors in U, which involve the pulses $\theta_1[\pm x]$; $\theta_2[x]$, and for convenience omitting the factor $\sin^2(\theta_3/2)$ for now, we have $$I^+(+)\alpha \ldots T(I_x,\theta_1) \exp(iI_x\theta_2)I^- \exp(-iI_x\theta_2)T^+(I_x,\theta_1)P(S) \ldots \quad [10]$$

where P(S) includes all the factors involving S in [9]. As for the basic DEPT sequence, only the term involving an $I_z$ component which results from [10] will give a non-zero contribution to the polarization transfer signal. This term is proportional to $$\sin\theta_2 T(I_x,\theta_1)I_z T^+(I_x,\theta_1) = \sin\theta_2 \cos\theta_1 I_z \quad [11]$$

which follows from [1].

Thus $\theta_1[\pm x]$ and $\theta_2[x]$ introduce extra factors $\cos\theta_1$ and $\sin\theta_2$ respectively into the overall signal. Thus, ignoring these factors for now and continuing by inserting the next factor into U, which involves the pulse cycle $\phi_2[\pm x, \pm y]$ we find that the signal is proportional to $$\ldots F(S,\phi_2)P(S)F^+(S,\phi_2)\ldots = \ldots F(S,\phi_2)\exp(-iS_y 2\phi_3)\exp(iS_z 2\pi)F^+(S,\phi_2)\ldots$$

where we have used standard commutation relations to simplify P(S) as shown. Now for a group $^{13}CH_n$ the value of $\exp(iS_z 2\pi)$ is just $(-1)^n$, so we have to find $F(S,\phi_2)\exp(-iS_y 2\phi_3)F^+(S,\phi_2)$. Because F is not unitary, this evaluation requires some care. We see that the result of the F operator is equivalent to the signal produced by $T(S_x,\phi_2)$ minus that produced by $T(S_y,\phi_2)$ so we need to evaluate $$-\exp(-iS_y 2\phi_3) + T(S_x,\phi_2)\exp(-iS_y 2\phi_3)T^+(S_x,\phi_2) \quad [12]$$

and divide this by two to find the average effect per transient. The second term is one-half of $$\exp(iS_x\phi_2)\exp(-iS_y 2\phi_3)\exp(-iS_x\phi_2) +$$
$$\exp(-iS_x\phi_2)\exp(-iS_y 2\phi_3)\exp(iS_x\phi_2) =$$
$$\pi_i [\cos\phi_3 - 2i\exp(iS_x^i\phi_2)S_y^i\exp(-iS_x^i\phi_2)\sin\phi_3] - (\phi_2 \to -\phi_2)$$

where $S_x^i$ is the operator for the i-th proton in the group $^{13}CH_n$, and the second term in the expression is obtained from the first by replacing $\phi_2$ by $-\phi_2$. The first term becomes $$\pi_i [\cos\phi_3 - 2i\sin\phi_3\cos\phi_2 S_y^i + 2i\sin\phi_3\sin\phi_2 S_z^i] \quad [13]$$

In finding this product we can neglect terms such as $S_y^i S_y^j$, which are of order higher than one, because the expectation values arising from such terms will involve powers greater than one of the small constant K in the high temperature Boltzmann distribution, and are therefore negligible. Including the term $(\phi_2 \to -\phi_2)$ this leaves us, after division by two, with $$\cos^n\phi_3 - 2i\cos^{n-1}\phi_3\sin\phi_3 S_y\cos\phi_2 \quad [14]$$

The first term in [12] is $$-\pi_i(\cos\phi_3 - 2i S_y^i \sin\phi_3) \quad [15]$$

and, using the same arguments as above in its evaluation, we obtain $$-\cos^n\phi_3 - 2i\cos^{n-1}\phi_3\sin\phi_3 S_y, \quad [16]$$

so adding [14] and [16] and dividing by two gives us a result proportional to $$\cos^{n-1}\phi_3\sin\phi_3 S_y(1-\cos\phi_2)/2,$$

which is just a factor $\sin^2(\phi_2/2)$ times the normal DEPT result. Continuing with the evaluation of the signal, we no look at, again ignoring the multiplication factors found so far, $$I^+(t)\alpha \ldots$$
$$\exp(iS_y\phi)\exp(iI_z S_z\pi)I_z S_y\exp(-iI_z S_z\pi)\exp(-iS_y\phi)\ldots =$$
$$\ldots I_z\exp(iS_y\phi)S_x\sin I_z\pi\exp(-iS_y\phi)\ldots$$
$$\alpha S_x\cos\phi + S_z\sin\phi$$

The final step is to include $\phi_1[\pm y]$, giving a signal $$<I^+(t)>\alpha<T(S_y,\phi_1)S_x T^+(S_y,\phi_1)>\cos\phi + <T(S_y,\phi_1)S_z T^+(S_y,\phi_1)>\sin\phi$$

From the cyclic permutations of [1], [2] and [3] we see that the first term is proportional to $<S_x>$ which is zero. The second term gives a signal proportional to $\cos\phi_1\sin\phi$. Gathering all the constants we see that the signal is $$\cos\phi_1\sin\phi\sin^2(\phi_2/2)\cos\theta_1\sin\theta_2\sin^2(\theta_3/2)f(\phi_3) \quad [17]$$

where $f(\phi_3)$ is the normal DEPT signal.

The cycled pulses may be used more than once, for example in place of $\phi_1[\pm y]$ we might use $\phi_1[\pm y]\phi_4[\pm y]$. The effect of such repetition can be found by modifying the above derivation at the appropriate point. We find easily that $\phi_4[\pm y]$ just introduces another factor $\cos\phi_4$ and so on. Addition of $\theta_4[\pm x]$ before $\theta_1[\pm x]$ introduces a factor $\cos\theta_4$. We can even use multiple refocusing cycles, introducing an extra appropriate multiplicative factor for each cycle. Providing there are an odd number of cycles at each refocusing point, refocusing will be maintained.

From equation [17], sequence [B] yields signal intensity proportional to $$\theta\sin^3\theta\sin^3\phi f(\phi/2) \quad [18]$$

where $f(\phi/2)$ is $\sin(\phi/2)$, $\sin\phi$ and $0.75[\sin(\phi/2)+\sin(3\phi/2)]$ for CH, $CH_2$ and $CH_3$ moieties respectively. In this expression the $\theta$ factor allows for the sensitivity of the $^{13}C$ detection coil; the $\theta$ and $\phi$ pulses introduce a $\sin\theta$ and a $\sin\phi$ factor; the $2\theta[\pm x, \pm y]$ and $2\phi[\pm x, \pm y]$ pulses introduce $\sin^2\theta$ and $\sin^2\phi$ factors; and the $\phi/2$ pulse adds the $f(\phi/2)$ dependence. Because of the $\sin^3\theta$ and $\sin^3\phi$ dependences, signal intensity is suppressed for $\theta$ or $\phi$ pulse angles near 0°, 180°, 360° and so on.

For some applications using separate $^{13}C$ and $^1H$ coils of different dimensions and/or orientations, these $\sin^3\theta$ and $\sin^3\phi$ factors may produce sufficient localization of the sample sensitive volumes. However, for simple surface coils, previous studies indicate that this sample localization is unlikely to be good enough. Once again regarding DEPT as being, in part, composed of $^1$H and $^{13}$C spin-echo sequences, then by analogy with depth pulses additional sample localization can be generated by adding further phase-cycled $2\theta$ and $2\phi$ pulses:

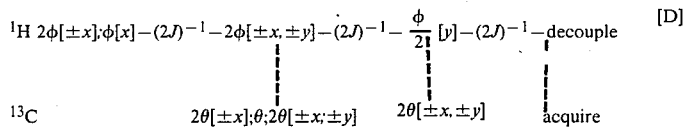

[D]

For sequence [D], the extra $2\theta[\pm x]$ and $2\phi[\pm y]$ pulses add $-\cos 2\theta$ and $-\cos 2\phi$ factors to expression [18]. The extra $2\theta[\pm x, \pm y]$ pulse introduces another $\sin^2 \theta$ factor yielding, overall, signal intensity proportional to $$\theta \cos 2\theta \sin^5 \theta \cos 2\phi \sin^3 \phi f(\phi/2) \qquad [19]$$

The total number of phase combinations and thus the total number of transients in each cycle is 256.

Figure 2:
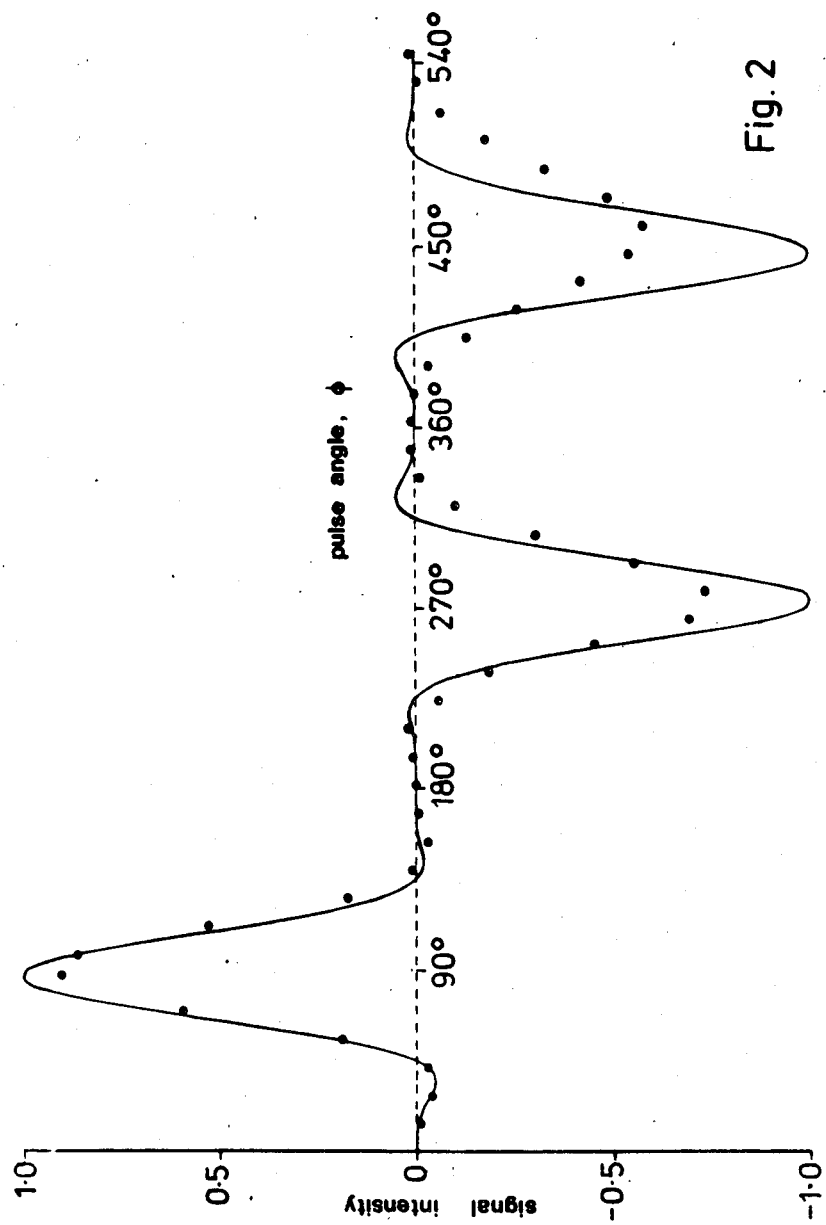
FIG. 2 is a diagram showing the dependence of signal intensity on the $^{1}H$ $\phi$ pulse length using the pulse sequence $2\phi[\pm x]$; $\phi[x]-(2J)^{-1}-2\phi[\pm x,\pm y]$; $(\pi/2)[C]-(2J)^{-1}-(\phi/2)[y]$; $\pi[C]-(2J)^{-1}$—acquire $^{13}C$ signal.
Figure 4:
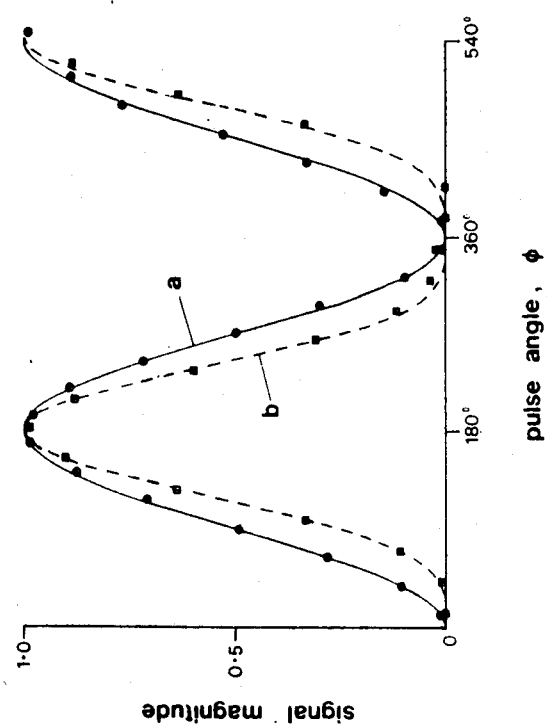
FIG. 4 is a diagram showing the dependence of signal intensity on the $^{13}C$ $\phi$ pulse length using a $^{1}H$ spin-echo sequence and particular simple and composite $^{13}C$ pulses specified in the description.

Expression [19] has been proven with comprehensive experimental support for each factor. FIG. 1 shows the $-\cos 2\theta \sin^5 \theta$ dependence of signal intensity expected for a small angle as a function pf incrementing the $\theta$ pulse length when using the four $^{13}$C pulses in sequence [D]. Similarly FIG. 2 shows the $-\cos 2\phi \sin^3 \phi f(\phi/2)$ dependence expected for a CH$_3$ group when incrementing the length of the $^1$H pulses in sequence [D]. In the latter case, because of the relative increase of the dimensions of the phantom sample compared to the dimensions of the smaller $^1$H coil, there was considerable variation of the $\phi$ pulse angle across the sample, and correspondence between theory and experiment decreases with increasing $^1$H pulse angles. Nevertheless, the data clearly supports the validity of expression [19]. These experiments and the measurements summarized in Table 1, were carried out using a 1,9 T, 30 cm bore magnet. The experimental points for FIGS. 1 and 2 and 4 were determined using a 9 mm diameter, 1,5 mm thick $^{13}$CH$_3$OH phantom sample coaxial with, and near the centers of, a 70 mm diameter $^{13}$C surface coil and a coaxial, coplanar, 35 mm diameter $^1$H surface coil. The $\theta = 90°$ pulse length was 20 μsec. The $\phi = 90°$ pulse length was 10 μsec.

Figure 3:
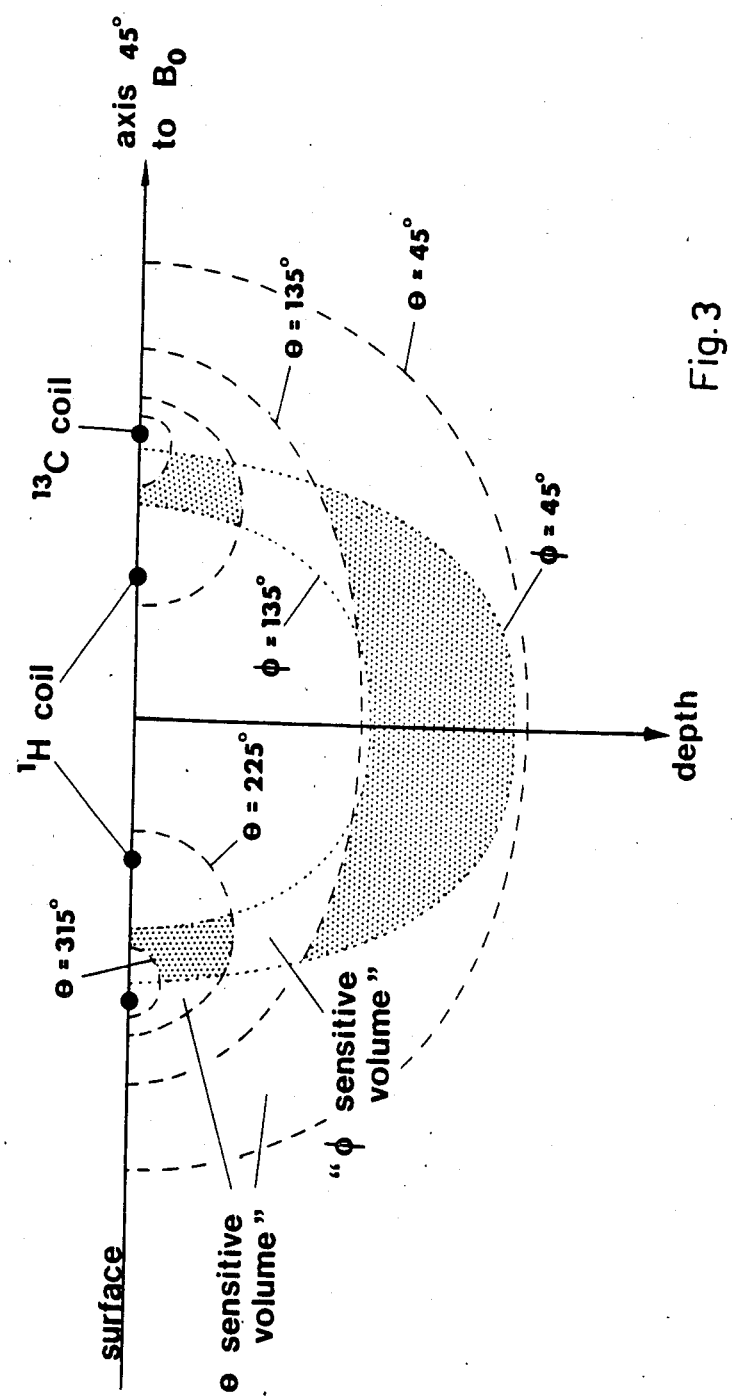
FIG. 3 is a schematic representation of cross section through the coils and the sample.

The degree of sample localization that can be achieved using a $^{13}$C surface coil and a coaxial, coplanar $^1$H coil of half the diameter is represented in FIG. 3. Because the $\theta$ factors are multiplied by the $\phi$ factors, signal intensity is restricted to regions where the "$\theta$ sensitive volume" overlaps the "$\phi$ sensitive volume". The "$\theta$ sensitive volume" is defined by $45° < \theta < 135°$ and $225° < \theta < 315°$ (see FIG. 1). The "$\phi$ sensitive volume" is defined by $45° < \phi < 135°$ (see FIG. 2).

One unwanted region is where $\phi \sim 90°$ and $\theta \sim 270°$. However, the $\theta \sim 270°$ region can be eliminated by accumulating 256 transients using sequence [D] with $\theta$ changed to $(\frac{2}{3})\theta$, and a second set of 256 transients with $\theta$ changed to $(4/3)\theta$, and summing the two sets in a 2:1 ratio respectively. Results using this 512 transient method, listed in Table 1, were obtained for a $^{13}$CH$_3$OH phantom positioned at various places in sample space. These results clearly show that excellent sample localization can be obtained. Although the total number of transients (512) in the complete cycle is large, applications in $^{13}$C in-vivo spectroscopy will in general require at least this number of transients for reasonable signal-to-noise.

Because of the different $f(\phi/2)$ factors for CH, CH$_2$ and CH$_3$ groups, the spatial dimensions of the "$\phi$ sensitive volume" will also be different. However, $-\cos 2\phi \sin^3 \phi f(\phi/2)$ has its first maximum at $\phi = 93.8°$, 90° and 86.7° for CH, CH$_2$ and CH$_3$ respectively, so this small difference will only marginally change the dimensions of the final localized volume.

At the centre of the final localized volume, by matching pulse lengths in initial set-up procedures, $\theta = \phi = 90°$. Thus maximum polarization transfer enhancement is achieved, a factor of 4 over the natural $^{13}$C magnetization at this point. Obviously this enhancement factor decreases as $\theta$ and $\phi$ diverge from 90°, but this is the origin of the spatial selectivity.

Other DEPT-related sequences may be applied in the same way with separate inhomogeneous rf coils. For example inverse DEPT which generates polarization transfer in the reverse direction from $^{13}$C to $^1$H, may be used by modifying the basic sequence in a very similar way to the generation of sequences [B] and [D]. Inverse DEPT enables the selective detection of protons attached to $^{13}$C nuclei in $^{13}$C labelled metabolites, which has the potential advantage of a very large gain in sensitivity over $^{13}$C spectroscopy.

Sample localization can be achieved using heteronuclear techniques other than DEPT and related polarization transfer methods. These other techniques rely on a different pulse sequence mechanism but still utilize the overlap of the two heteronuclear sensitive volumes from the separate heteronuclear rf transmitter coils. The shape of the sensitive volume for one of the two heteronuclei is still generated using depth pulse type schemes. However, for the second heteronucleus, the shape of the sensitive volume is determined by the probability of flipping the nucleus between its z eigenstates using an rf pulse at a particular point in the pulse sequence. If the pulse angle is $\phi$, the probability of flipping is $\frac{1}{2}(1-\cos \phi)$, the probability of not flipping is $\frac{1}{2}(1+\cos \phi)$, and the difference between the probability of not flipping and flipping is $\cos \phi$ (Pegg et al, Journal of Magnetic Resonance, 44, 238 (1981)). If the pulse applied to the second heteronucleus is a composite pulse, i.e. a sequence of pulses of different phases (Freeman et al, Journal of Magnetic Resonance, 38, 453 (1980)), then probabilities still depend on $\cos \phi$ where $\phi$ is the final overall angle through which an initial z axis vector is rotated by the composite pulse. For an initial z axis vector of unit magnitude, $\cos \phi$ is the z axis component remaining after the composite pulse, and this component can be readily calculated from simple three-dimensional geometry. Listing some of the intermediate results as well, and beginning with a unit z axis vector, we have after a $\delta_1[x]$ pulse:

$$z \text{ component} = \cos \delta_1 \qquad [20]$$

$$y \text{ component} = \sin \delta_1 \qquad [21]$$

$$x \text{ component} = 0, \qquad [22]$$

and after a $\delta_1[x]$; $\delta_2[y]$ composite pulse:

$$z \text{ component} = \cos \delta_1 \cos \delta_2 \quad [23]$$

$$y \text{ component} = \sin \delta_1 \quad [24]$$

and after a $\delta_1[x]$; $\delta_2[y]$; $\delta_3[x]$ composite pulse:

$$z \text{ component} = \cos \delta_1 \cos \delta_2 \cos \delta_3 - \sin \delta_1 \sin \delta_3 \quad [25]$$

Results [20], [23] and [25] are used below to calculate the dependence of signal intensity on the pulses applied to the second nucleus for two different heteronuclear methods, included here as examples.

EXAMPLE 1

Detection of $^{13}CH_n$ groups in $^1H$ NMR using the carbon-flip spin-echo method Consider the sequence:

$$\frac{\pi}{2} [H] - (2J)^{-1} - \pi[H];\phi_1[C] - (2J)^{-1} - \text{acquire } ^1H, \text{ add} \quad [E]$$

$$\frac{\pi}{2} [H] - (2J)^{-1} - \pi[H];\phi_2[C] - (2J)^{-1} - \text{acquire } ^1H, \text{ subtract}$$

The add/substract signifies addition of the transients resulting from the first experiment and subtraction of transients resulting from the alternate second experiment, and this cancels all $^1H$ signals except those arising from $^{13}CH_n$ groups. The $^1H$ signal arising from $^{13}CH_n$ groups for the first experiment is proportional to $\cos \phi_1$, i.e. the probability that the $\phi_1$ pulse does not flip the $^{13}C$ nuclei between the z eigenstates minus the probability that the pulse does flip the nuclei. Similarly, the alternate experiment yields $^{13}CH_n$ signals proportional to $\cos \phi_2$, so overall $$\text{signal intensity} \propto \tfrac{1}{2}(\cos \phi_1 - \cos \phi_2) \quad [26]$$

If $\phi_2 \equiv \phi$ and the $\phi_1$ pulse is omitted, i.e. $\phi_1 = 0$ then from [7], $$\text{signal intensity} \propto \tfrac{1}{2}(1 - \cos \phi_2) = \sin^2 (\phi/2) \quad [27]$$

Thus a $^{13}C$ sensitive volume determined by $\sin^2 (\phi/2)$ is generated. This is probably not restrictive enough for a $^{13}C$ surface coil, but may be sufficient for other rf coil shapes. If the $\phi_1$ pulse is replaced by the composite pulse, $(\phi/2)[x]$; $\phi[y]$; $(\phi/2)[x]$ and the $\phi_2$ pulse by the composite pulse $\phi[x]$; $\phi[y]$ then from equations [25] and [23] respectively, equation [26] becomes $$\text{signal intensity} \propto \tfrac{1}{2}(\cos^2 (\phi/2) \cos \phi - \sin^2 (\phi/2) - \cos^2 \phi) = \sin^4 (\phi/2) \quad [28]$$

The $\sin^4 (\phi/2)$ dependence will give a sufficiently restricted sensitive volume for a $^{13}C$ surface coil. The experimental data in FIGS. 4(a) and (b) show the expected $\sin^2 (\phi/2)$ and $\sin^4 (\phi/2)$ dependences of signal intensity obtained by incrementing the $\phi$ pulse length of the $^{13}C$ pulses when using sequence [E] and the $\phi_1$ and $\phi_2$ pulses specified above.

To exemplify the use of the method, FIG. 3 is again relevant with the large coil being the $^1H$ coil and the small coil the $^{13}C$ coil. The $^{13}C$ sensitive volume generated by the small coil will depend on $\sin^2 (\phi/2)$ or $\sin^4 (\phi/2)$ as given by equations [27] or [28]. For an inhomogeneous rf coil such as a surface coil, the $\pi/2$ and $\pi$ $^1H$ pulses in sequence [E] will be replaced by $\theta$ and $2\theta[\pm x, \pm y]$ respectively. The $^1H$ sensitive volume can be restricted at will by adding further phase-cycled $^1H$ pulses such as $2\theta[\pm x]$ or $2\theta[\pm x, \pm y]$ in the usual way for depth pulse schemes. Overall, significant signal intensity will only be obtained from the region where the $^1H$ sensitive volume overlaps the $^{13}C$ sensitive volume.

EXAMPLE 2

Detection of $^{13}CH_n$ groups in $^1H$ NMR by selective polarization transfer

For simplicity we will discuss only the case of a methine group, i.e. $^{13}CH$, as an example. With some variations, the method will work for the more complicated coupled multiplets of $^{13}CH_2$ and $^{13}CH_3$ groups and will also work for polarization transfer in the reverse direction to yield selective $^{13}C$ spectra.

For a $^{13}CH$ group, polarization can be transferred from carbon to proton by inverting one half of the $^{13}C$ magnetization, i.e. by applying a selective $\pi$ pulse to one line of the doublet in the $^{13}C$ spectrum, $C_A$ say, and then applying a $\pi/2$ proton pulse (Jakobsen et al, Journal of Magnetic Resonance, 54, 134 (1983)). Alternatively, a selective $\pi$ pulse can be applied to the other line of the $^{13}C$ doublet, $C_B$, followed by a $(\pi/2) [H]$ pulse. The polarization transfer signal may be accumulated from the two experiments by subtracting the result of the second from the first, and this alternate addition/subtraction eliminates all other $^1H$ signals. If the pulse applied to the carbon nuclei is some variable angle $\phi$, as occurs for an inhomogeneous rf coil, the sequence may be written:

$$\text{sel.}\phi[C_A]; \frac{\pi}{2} [H]; \text{ acquire } ^1H, \text{ add} \quad [F]$$

$$\text{sel.}\phi[C_B]; \frac{\pi}{2} [H]; \text{ acquire } ^1H, \text{ subtract}$$

and it is easily shown that signal intensity is proportional to the probability that the $\phi$ pulse flips the carbon nuclei from the z to the $-z$ eigenstate, i.e. signal intensity $\propto \tfrac{1}{2}(1 - \cos \phi)$ Sequence [F] can be extended by applying selective pulses to both $C_A$ and $C_B$:

$$\text{sel.}\phi_2[C_A]; \text{sel.}\phi_1[C_B]; \frac{\pi}{2} [H]; \text{ acquire } ^1H, \text{ add} \quad [G]$$

$$\text{sel.}\phi_1[C_A]; \text{sel.}\phi_2[C_B]; \frac{\pi}{2} [H]; \text{ acquire } ^1H, \text{ subtract}$$

leading to $$\text{signal intensity} \propto \tfrac{1}{2}(1 - \cos \phi_2) - \tfrac{1}{2}(1 - \cos \phi_1) = \tfrac{1}{2}(\cos \phi_1 - \cos \phi_2), \quad [29]$$

i.e. identical with equation [26]. Thus, for example, the $\phi_1$ and $\phi_2$ pulses may be chosen as in the above examples which led to equations [27] and [28], and so the $^{13}C$ sensitive volume may be generated as described for the carbon-flip spin-echo method. If the $^1H$ coil is also an inhomogeneous radiofrequency coil, the $\pi/2[H]$ pulse becomes $\theta$ and depth pulse schemes may be added to generate a restrictive $^1H$ sensitive volume again in an analogous fashion to that described in the previous example. Once more, significant signal intensity will only be obtained from the region where the $^1$H sensitive volume overlaps the $^{13}$C sensitive volume.

In the above Examples 1 and 2, only one specific example of composite pulses (which led to equation [28]) was given. There are many other possible useful composite pulses. For example, Shaka and Freeman, Journal of Magnetic Resonance, 59, 169 (1984) and Tycko and Pines, 60, 156 (1984) have described a family of composite pulses, consisting of 3, 9, or 27 single pulses. Any of these may be used for $\phi_2$ with $\phi_1=0$ in either of Examples 1 and 2.

TABLE 1

Relative signal intensities (%) obtained from a 9 mm diameter, 1.5 mm thick, $^{13}$CH$_3$OH phantom sample located at various positions relative to a 70 mm diameter $^{13}$C surface coil and a coaxial coplanar, 35 mm diameter $^1$H surface coil.[a]

| depth (mm) | distance along axis 45° to $B_o$ (mm) | | | |
|---|---|---|---|---|
| (x axis) | 0 | 10 | 20 | 30 |
| 0 | —[b] | — | — | — |
| 5 | — | — | — | — |
| 10 | — | — | — | — |
| 15 | — | — | 18 | — |
| 20 | 13 | 97 | 56 | — |
| 25 | 100 | 74 | 10 | |
| 30 | 24 | 15 | — | |
| 35 | — | — | — | |

[a]The phantom was positioned in a plane 45° to $B_o$, the main field axis. The plane of the phantom was parallel to the plane of the coils. The $\theta$ and $\phi$ pulses were both set at 50 μsec.
[b]Signal intensity less than noise level, i.e. <2%.

We claim:

1. A method of operating a nuclear magnetic resonance spectrometer in relation to a sample comprising two types of nuclear magnetic resonators, by applying to the sample a sequence of radiofrequency pulses and delay periods, the pulses thereof comprising radiofrequency bursts of two different radiofrequencies corresponding to the resonant frequencies of the two types of magnetic resonators, such that the scaler coupling interactions between the two types of magnetic resonators are allowed to evolve, characterized in that pulses of rf bursts at one of the two radiofrequencies are applied to one of two spaced coils and pulses of rf bursts at the other radiofrequency are applied to the other coil, the two spaced coils being shaped and positioned to provide inhomogeneous rf fields in the sample to overlap sensitive volumes of their rf fields at a region of the sample so that NMR signal emission of greatest intensity will be obtained from the overlapping sensitive volumes.

2. A method as claimed in claim 1 wherein the radiofrequency pulse sequence used in a DEPT or inverse DEPT sequence, said pulse sequence being modified by inclusion of phase-cycled radiofrequency pulses, in the manner of depth pulse schemes, for both types of resonators to generate the two overlapping sensitive volumes.

3. A method as claimed in claim 1 wherein the radiofrequency pulse sequence comprises a spin-echo sequence applied to one type of resonator, said spin-echo sequence being modified by inclusion of phase-cycled radiofrequency pulses, in the manner of a depth pulse scheme, to generate a sensitive volume for the first type of resonator, and a radiofrequency pulse, or composite radiofrequency pulse, being applied during of the spin-echo delay period to the second type of resonator such that a sensitive volume is generated for the second type of resonator, the said radiofrequency pulse, or composite radiofrequency pulse being modified in alternate experiments, the signals resulting from said alternate experiments being subtracted.

4. A method as claimed in claim 1 wherein the radiofrequency pulse sequence is a selective polarization transfer sequence wherein the sensitive volume for the first type of resonator is generated by applying two different selective radiofrequency pulses, or selective composite radiofrequency pulses, to two lines of the scalar coupled multiplet of the first type of resonator, and wherein the sensitive volume for the second type of resonator is generated by inclusive of phase-cycled radiofrequency pulses, in the manner of a depth pulse scheme, for the second type of resonator.

* * * * *